United States Patent [19]

Iseki et al.

[11] Patent Number: 4,925,388

[45] Date of Patent: May 15, 1990

[54] APPARATUS FOR HEAT TREATING SUBSTRATES CAPABLE OF QUICK COOLING

[75] Inventors: Izuru Iseki; Akihiro Higashi; Seihiro Sasaki, all of Kyoto, Japan

[73] Assignee: Dainippon Screen Mfg. Co., Ltd., Japan

[21] Appl. No.: 411,224

[22] Filed: Sep. 22, 1989

Related U.S. Application Data

[63] Continuation of Ser. No. 236,633, Aug. 25, 1988, abandoned.

[30] Foreign Application Priority Data

Aug. 26, 1987 [JP] Japan ............................ 62-213515

[51] Int. Cl.⁵ .............................................. F27D 15/02
[52] U.S. Cl. ..................................... 432/77; 432/205;
432/253; 432/258
[58] Field of Search ..................... 432/77, 81, 83, 5, 6,
432/253, 11, 258, 205

[56] References Cited

U.S. PATENT DOCUMENTS

| | | | |
|---|---|---|---|
| 2,257,229 | 9/1941 | Drake | 432/181 |
| 2,397,810 | 4/1946 | Roff | 432/181 |
| 3,622,135 | 11/1971 | Bauer | 432/205 |
| 3,918,890 | 11/1975 | Blaine | 432/181 |
| 4,351,805 | 9/1982 | Reisman et al. | 432/205 |
| 4,430,055 | 2/1984 | Sugiyama | 432/205 |
| 4,560,348 | 12/1985 | Moller et al. | 432/77 |

Primary Examiner—Henry C. Yuen
Attorney, Agent, or Firm—Ostrolenk, Faber, Gerb & Soffen

[57] ABSTRACT

An apparatus for heat treating and quickly cooling substrates. The apparatus includes a cylindrical furnace core tube for containing substrates, a heater enclosing the furnace core tube, and outer cylinder enclosing and containing the furnace core tube and the heater, a blower for drafting cooling air to the space between the furnace core tube and the outer cylinder along the longitudinal direction of the furnace core tube, and a switching valve connected between the blower and both ends of the outer cylinder for switching the direction in which the cooling air travels. Since the direction of the cooling air is changed, the entire furnace core tube is uniformly cooled.

20 Claims, 3 Drawing Sheets 4,925,388

APPARATUS FOR HEAT TREATING SUBSTRATES CAPABLE OF QUICK COOLING

This is a continuation of application Ser. No. 07/236,633 filed on Aug. 25, 1988 now abandoned.

BACKGROUND OF THE INVENTION

1. Field of the Invention

The present invention relates to an apparatus for heat treating substrates and, in particular, for heating semiconductor substrates (hereinafter simply referred to as substrates) in a furnace core tube to carry out a desired process on the substrates. The furnace may be an oxidation furnace, diffusion furnace, reaction furnace for a CVD (chemical vapored deposition) device and so on. In particular, the invention relates to a heat treating apparatus suitable for quick heating and quick cooling.

DESCRIPTION OF THE PRIOR ART

An apparatus of particular interest to the present invention is disclosed in, for example, Semiconductor World 1985, 12, p 65. FIG. 1 is a conventional apparatus disclosed therein. A furnace having a small heat capacity has been employed to heat the substrates. The reason for this is that the smaller the heat capacity, the shorter the time required for heating and cooling. The shorter time enables higher processing efficiency.

Referring to FIG. 1, a conventional apparatus for heat treating substrates comprises a furnace core tube 102 formed of quartz containing substrates 101, a heater 103 provided on the outer circumference of the furnace core tube 102, an outer cylindrical furnace 105 formed of a material which has small heat capacity, and a forced cooling blower 123 for ventilating cooling air to a gap between the furnace core tube 102 and the outer cylindrical furnace 105. The apparatus is structured such that the temperature in the furnace can be quickly heated or quickly cooled. In the conventional apparatus, the cooling air is drafted in a prescribed heat treatment, the cooling air is drafted in a prescribed direction from one end to the other end of the reaction furnace core tube 102 by the forced cooling blower 123. Therefore, cooling in the longitudinal direction of the reaction furnace core tube 102 becomes uneven. That is, the substrates 101 are quickly cooled at a windward end, and slowly cooled at the leeward end. If the speed at which the substrates 101 cool is uneven, the quality of the substrates becomes uneven and the manufacturing yield of the apparatus is reduced.

SUMMARY OF THE INVENTION

Therefore, one object of the present invention is to provide an apparatus for heat treating substrates capable of quick cooling, in which production yield of the substrates is not degraded.

Another object of the present invention is to provide such an apparatus in which the substrates are cooled evenly.

A further object of the present invention is to provide a heat treating apparatus in which temperature can be accurately adjusted.

The above described objects of the present invention can be attained by an apparatus which comprises: a container extending in a longitudinal direction for containing substrates; a heater arranged to enclose the container; an enclosure arranged to enclose the container and the heater for containing the container and the heater, a space formed between said enclosure and the container along the longitudinal direction serving as a path for cooling gas to cooling the container; a cooling apparatus for ventilating the cooling gas in the space; and a ventilating direction switching member for switching the direction in which the cooling gas is ventilated along the longitudinal direction of the apparatus.

Since the apparatus comprises the above described component, the cooling gas is drafted with the direction of ventilation switched with respect to the longitudinal direction of the container. Therefore, the container is uniformly cooled. Consequently, the substrates contained therein are also uniformly cooled and thus defective substrates are not generated. Therefore, an apparatus for heat treating substrates capable of quick cooling can be provided in which the production yield of the substrates is not degraded.

According to a preferred embodiment of the present invention, the cooling apparatus controllably and uniformly lowers the temperature of the container. Therefore, the container is evenly cooled. Therefore, an apparatus capable of quick cooling can be provided in which the speed of cooling the substrates contained in the container is kept uniform.

According to a more preferred embodiment of the present invention, the temperature controller comprises a plurality of temperature detectors provided in the longitudinal direction of the container, and the cooling apparatus controls the switching member in response to outputs of the temperature detectors. Plural sets of heaters are provided along the longitudinal direction, and the temperature controller comprises heating controllers for controlling each set of heaters.

Since the apparatus comprises the above described components, the temperature of respective portions of the furnace core tube is detected and the heater and the direction of drafting cooling gas are controlled in accordance with the detected temperature. Therefore, the temperature of the container can be correctly controlled. The temperature of the substrates held in the container can be surely adjusted. Therefore, an apparatus capable of correct temperature adjustment can be provided.

These objects and other objects, features, aspects and advantages of the present invention will become more apparent from the following detailed description of the present invention when taken in conjunction with the accompanying drawings.

DESCRIPTION OF THE PREFERRED EMBOOIMENTS

Figure 1:
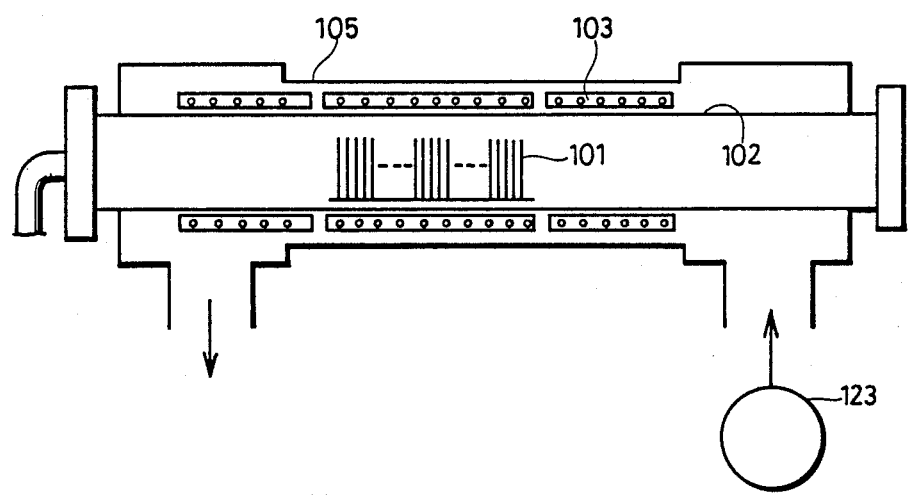
FIG. 1 is a schematic diagram showing a conventional apparatus for heat treating substrates.

The preferred embodiment includes a quick cooling type heat treating apparatus comprising a reaction furnace core tube 2 with quartz containing substrates 1 therein; a cylindrical heat generator 3 (including a plurality of heating elements) enclosing the reaction furnace core tube 2; an insulation body 5 containing both the reaction furnace core tube 2 and the cylindrical heat generator 3; forced a cooling blower 23 for ventilating cooling gas (such as air) outside the reaction furnace core tube 2 along the axial direction; ventilating direction switching device 24 provided in association with the forced cooling blower 23 for switching the direction of ventilation of the cooling air; and cooling control system 25 for controlling the temperature of the furnace in the longitudinal direction so that the temperature is lowered uniformly.

The insulation body 5 comprises an inner cylinder 6 formed of a material which is heat resistant but which transmits heat rays (such as quartz glass), a cylindrical heat ray reflecting mirror 8 formed of a heat insulating material (such as ceramics) with gold (Au) film deposited on the inner circumferential surface thereof, and an outer cylinder 9 also formed of a heat insulating material. The insulation body 5 is supported by a set of upper and lower supporting flanges 12a and 12b. The inner cylinder 6 and the reflecting mirror 8 have their ends supported by the supporting flanges 12a and 12b with spacers 13a and 13b interposed therebetween. The spacers 13a and 13b are formed of ceramics. The ceramics spacers 13a and 13b are formed of alumina fiber. The gap between the inner cylinder 6 and the reflecting mirror 8 is set at a suitable distance, for example, less than 20 mm. Consequently, a gas-filled, heat insulating layer 10 is formed between the inner cylinder 6 and the heat ray reflecting mirror 8.

The gas layer 10 suppresses convection through the gas in the layer and prevents the heat in the furnace from being conducted and lost to the outside. Since radiation heat is transmitted through the layer 10, the reflecting mirror 8 is provided to reflect the radiation heat. Thus, heat is enclosed within the furnace and not lost.

The cylindrical heat generator 3 is a cylindrical porous plate with Kanthal Af (produced by Kanthal Co., Inc.) being employed as the heating material. Both ends of the generator 3 are insulated and supported by the supporting flanges 12a and 12b through supporting rings 14a and 14b which are formed of alumina.

The cylindrical heat generator 3 is longitudinally divided into a central zone 3B and end zones 3A and 3C. At opposite ends of each of the divided portions 3A, 3B and 3C, angular heat resisting electrodes 4a to 4d are provided with respective pairs of are for independent heat generating control of each of the portions. The terminals (not shown) of the electrodes extend to a position outside the furnace and are connected to a power supply switch 28.

Figure 2:
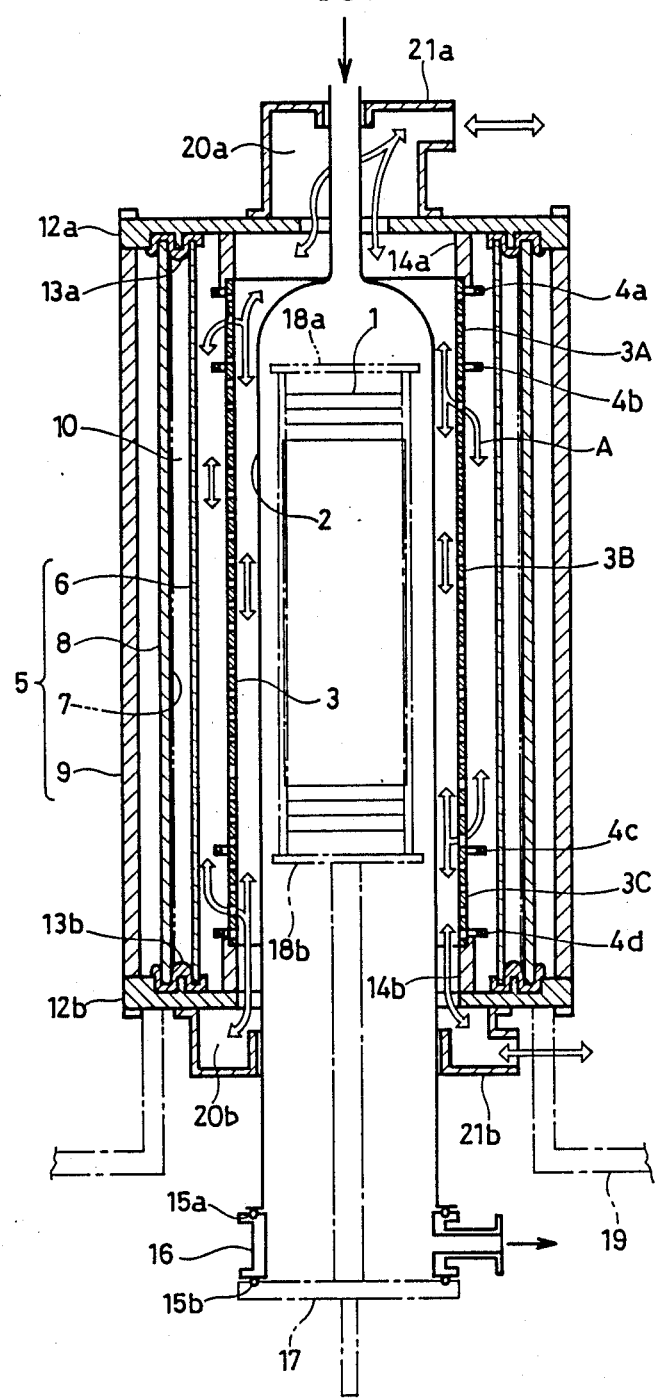
FIG. 2 is a sectional view of an apparatus in accordance with the present invention.
Figure 3:
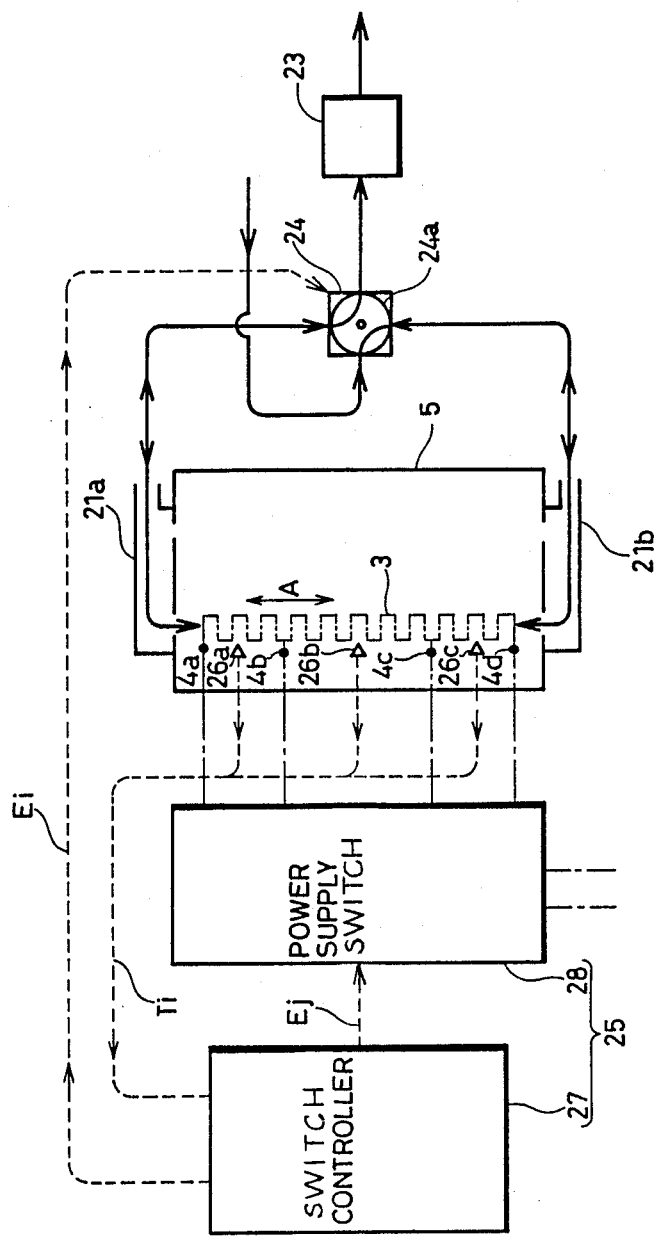
FIG. 3 shows a cooling control system for the apparatus shown in FIG. 2.

The reaction furnace core tube 2 is inserted in the cylindrical heat generator 3 with the lower end portion thereof connected to a discharging flange 16 through an O ring 15a. The O ring 15a is supported by a boat supporting table 17 through an O ring 15b. In FIG. 2, reference numeral 18a represents a substrate boat, 18b represents a boat supporting table, and 19 represents a frame for supporting the whole furnace.

Inlet and outlet boxes 21a and 21b respectively forming inlet and outlet ports 20a and 20b are provided on the supporting flanges 12a and 12b. The inlet and outlet boxes 21a and 21b are respectively connected to a four way switching valve 24 for switching the direction of ventilation. The direction of ventilation is ultimately toward a forced discharging blower 23.

The four way switching valve 24 inverts the flow of cooling air (arrow A) by rotating a rotor 24a by 90°. Switching of the valve 24 is controlled by a cooling control system 25.

The cooling control system 25 comprises a plurality of temperature detecting elements 26a, 26b and 26c provided along the longitudinal direction of the furnace, a switching controller 27 for controlling the switching of the four way switching valve 24 and a power supply switch 28 for controlling the power supply to the individual heating elements of the cylindrical heat generator 3 as a function of the temperature signal Ti from the temperature detecting elements 26a, 26b and 26c.

The temperature detecting elements 26a, 26b and 26c comprise thermocouples provided at each of the three divided portions 3A, 3B and 3C of the cylindrical heat generator 3, for example, and the temperature in the longitudinal direction of the furnace is detected by the thermocouples.

The power supply switches 28 appropriately switch the power supply to each of the three divided portions 3A, 3B and 3C of the cylindrical heat generator 3 based on a contact signal Ej from the switch controller 27. The switch controller 27 monitors the temperature difference, in the longitudinal direction of the furnace as a function of the temperature signal Ti. Wherever the temperature difference becomes larger than a prescribed value, the switch controller 27 outputs a control signal Ei to switch the direction of the ventilation of the cooling air by means of the four way switching valve 24 in order to eliminate the temperature difference. The switch controller 27 also outputs a control signal Ej to the power supply switch 28 to switch the power supply to the heat generator 3 to prevent excessive cooling. The furnace is thus uniformly, controllably cooled in the longitudinal direction. The power supply switch 28 switches power to the individual section of the heat generator 3 so that the heat generator 3 uniformly generates heat when the temperature is raised or lowered, and when a high temperature is to be maintained. control system 25 is not always needed. The ventilation direction switching device 24 may be switched at prescribed time periods using a timer, for example. Further cooling control may be carried out without heat generating control by the power supply switch 28.

Although description was given of a vertical type heat treating furnace in which the axis of the reaction furnace core tube is arranged vertically, the present invention may be applied to a horizontal type heat treating furnace.

As is apparent from the above description, in the present invention, the direction of ventilation of the cooling air is alternately switched from one end to the other of the reaction furnace core tube. Therefore, all the substrates in the tube are approximately uniformly cooled. Consequently, unevenness in the quality of the substrates caused by uneven cooling can be eliminated and the production yield of the substrates can be improved.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An apparatus for heat treating a substrate, said apparatus comprising:
   container means extending in a longitudinal direction for containing a substrate to be heat treated;

heater means enclosing said container means for heating said substrate;
enclosing means enclosing both said container means and heater means for containing said container means and heater means;
means defining a space serving as a path of cooling air for cooling said container means along said longitudinal direction;
cooling means for circulating said cooling air through said space along said longitudinal direction, said cooling means including circulation direction switching means for reversing the direction of circulation of said cooling air along said longitudinal direction.

2. Apparatus according to claim 1, wherein said cooling means reverses the direction of circulation of said cooling air as a function of the temperature in said container.

3. Apparatus according to claim 2, wherein said cooling means includes a plurality of temperature sensors disposed at spaced location along said longitudinal direction and wherein said cooling means reverses the direction of circulation of said cooling air as a function of the output of said sensors.

4. Apparatus according to claim 3, wherein said cooling means reverses the direction of circulation of said cooling air whenever said temperature sensors indicate that the temperature difference at longitudinally spaced portion of said container exceeds a predetermined value.

5. Apparatus according to claim 1, wherein said means defining a space has first and second intake/exhaust ports and said cooling means causes said cooling air to travel from said first intake/exhaust port to said second intake/exhaust port when said cooling air flows in a first longitudinal direction and causes said cooling air to travel from said second intake/exhaust port to said first intake/exhaust port when said cooling air flows in a second opposite longitudinal direction.

6. Apparatus according to claim 5, wherein said cooling means includes a single source of cooling air including a first non-reversible blower and wherein said circulation direction switch means is coupled between said blower and said first and second intake/exhaust ports.

7. Apparatus according to claim 1, further including semiconductor substrates located in said container means.

8. An appatus for heat treating a substrate, comprising:
an axially elongated container for holding substrates to be heated;
a heater for heating said container, said heater enclosing said container;
means for enclosing both said container and said heater;
means defining a cooling fluid flow path around said container;
means for circulating cooling fluid along said path to cool said container; and
means for switching the direction of the circulation of said cooling fluid with respect to the axis of said axially elongated container to more uniformly cool said container along the axial length thereof.

9. An apparatus according to claim 8, wherein:
said cooling fluid flow path means includes a first end and a second end which is opposed said first end; and
said switching means comprises a valve for switching the direction of the circulation of said cooling fluid, and a means for connecting said valve, said first end, and said second end such that said cooling fluid is alternately circulated through said cooling fluid flow path from said first to said second end and from said second to said first end.

10. An apparatus according to claim 9, wherein:
said valve comprises a a four way switching valve;
said cooling fluid flow path means comprises an air duct; and
said circulating means comprises a blower.

11. An apparatus according to claim 8, further comprising means for controllably lowering the temperature of said container uniformly along the length thereof.

12. An apparatus according to claim 11, wherein said temperature lowering means comprises a plurality of temperature detecting means provided along the length of said container.

13. An apparatus according to claim 12, wherein:
said temperature detecting means include means for generating an output representative of temperature; and
said temperature lowering means includes means for controlling said switching means in response to the output generated by said temperature detecting means.

14. An apparatus according to claim 13, wherein:
said heater includes plural sets of heaters arranged along the length of said container; and
said temperature lowering means comprises means for controlling each set of said plural sets of heaters.

15. An apparatus according to claim 8, further comprising:
heat intercepting means provided between said heater and said enclosing means;
a heat insulating layer provided between said heat intercepting means and said enclosing means, said heat insulating layer having a gas sealed therein; and
heat ray reflecting means formed on an inner surface of said enclosing means.

16. An apparatus according to claim 15, wherein:
said heater includes means for irradiating heat to heat a substrate; and
said heat intercepting means is formed of a heat resisting material which can transmit heat.

17. An apparatus according to claim 16, wherein:
said heat insulating layer has a prescribed gap defined by said heat intercepting means and said enclosing means; and
said prescribed gap has a dimension selected to suppress convection of said gas sealed in said heat insulating layer.

18. An apparatus according to claim 17, wherein said gas sealed in said heat insulating layer comprises an inactive gas having low conductivity.

19. An apparatus for heat treating a substrate, comprising:
(A) container means extending in a longitudinal direction for containing a substrate;
(B) heater means enclosing said container means;
(C) enclosing means for enclosing both said container means and heater means, said enclosing means including first and second ends located at opposed longitudinal ends of said container means;

(D) a space being formed between said enclosing means and said container means, said space serving as a path of cooling air for cooling said container means along said longitudinal direction;
(E) cooling means for circulating said cooling air through said space, said cooling means comprising a blower; and
(F) circulation direction switching means for switching the direction of circulation of said cooling air along said longitudinal direction, said circulation direction switching means comprising:
 (i) a four-way switching valve for switching the direction of circulation of said cooling air, and
 (ii) a cooling air circulating path for connecting said switch valve and said first and second ends of said enclosing means, said cooling air circulating path comprising an air duct.

20. An apparatus for heat treating a substrate, comprising:
(A) container means extending in a longitudinal direction for containing a substrate;
(B) heater means including a plurality of heaters arranged along said longitudinal direction, said heater means enclosing said container means;
(C) enclosing means for enclosing both said container means and heater means;
(D) a space being formed between said enclosing means and said container means, said space serving as a path of cooling air for cooling said container means along said longitudinal direction;
(E) circulation direction switching means for switching the direction of circulation of said cooling air in association with said longitudinal direction;
(F) cooling means for circulating said cooling air to said space, said cooling means comprising temperature control means for controlling temperature of said container means such that said temperature is uniformly lowered along said longitudinal direction and for controlling said circulating direction switching means in response to an output from said temperature detecting means; said temperature control means comprising:
 (1) a plurality of temperature detecting means providing in the longitudinal direction of said container means; and
 (2) heating control means for controlling each set of said plural sets of heater means.

* * * * *